United States Patent
Shih et al.

(10) Patent No.: US 6,174,795 B1
(45) Date of Patent: Jan. 16, 2001

(54) METHOD FOR PREVENTING TUNGSTEN CONTACT PLUG LOSS AFTER A BACKSIDE PRESSURE FAULT

(75) Inventors: Po-Jen Shih, Taipei; Po-Jen Chen, Tainan, both of (TW)

(73) Assignee: Taiwan Semiconductor Manufacturing Co., Ltd, Hsin Chu (TW)

(*) Notice: Under 35 U.S.C. 154(b), the term of this patent shall be extended for 0 days.

(21) Appl. No.: 09/282,993

(22) Filed: Mar. 31, 1999

(51) Int. Cl.[7] .................................................... H01L 21/44
(52) U.S. Cl. ........................ 438/597; 438/637; 438/648; 438/656; 438/668; 438/675; 438/672; 438/680; 438/685
(58) Field of Search ..................................... 438/597, 710, 438/643, 238, 675, 668, 672, 680, 685, 637, 648, 656, 712; 437/187

(56) References Cited

U.S. PATENT DOCUMENTS

| | | | |
|---|---|---|---|
| 5,521,119 | * | 5/1996 | Chen et al. ........................... 437/187 |
| 5,599,739 | * | 2/1997 | Merchant et al. .................... 437/190 |
| 6,022,800 | * | 2/2000 | Ho et al. .............................. 438/643 |
| 6,022,809 | * | 2/2000 | Fan ....................................... 438/710 |
| 6,048,794 | * | 4/2000 | Chen et al. ........................... 438/675 |
| 6,100,126 | * | 8/2000 | Chen et al. ........................... 438/238 |

* cited by examiner

*Primary Examiner*—Matthew Smith
*Assistant Examiner*—Belur Keshavan
(74) *Attorney, Agent, or Firm*—Tung & Associates

(57) ABSTRACT

A method for preventing tungsten contact plug loss problem after a backside pressure fault problem in a deposition chamber is provided. In the method, first deposited by a silane soak step and a tungsten nucleation layer is subsequently deposited, a heat treating step by a rapid thermal process is carried out at a temperature of at least 600° C. for a time period of at least 10 seconds. The heat treating step significantly improves the uniform distribution of the silicon prenucleation layer and substantially prevents the formation of any tungsten silicide layers such that during an etchback process, the dry etchant utilized does not remove a tungsten silicide layer at a much faster rate and thereby does not result in a plug loss problem.

17 Claims, 2 Drawing Sheets

| SAMPLE | BSPF | vacuum break | anneal time | scrubber | W-loss |
|---|---|---|---|---|---|
| 1 | no, but stop on step 7 | Y | N | N | N |
| 2 | Y | N | N | N | Y |
| 3 | Y | Y | N | N | Y |
| 4 | Y | Y | N | Y | Y |
| 5 | Y | Y | 690C10S | Y | N |
| 6 | Y | Y | 690C10S | N | N |
| 7 | Y | Y | 690C20S | N | N |
| 8 | Y | Y | 690C30S | N | N |
| 9 | Y | Y | 690C45S | N | N |
| 10 | Y | Y | 690C60S | N | N |

METHOD FOR PREVENTING TUNGSTEN CONTACT PLUG LOSS AFTER A BACKSIDE PRESSURE FAULT

FIELD OF THE INVENTION

The present invention generally relates to a method for preventing tungsten contact plug loss in a tungsten CVD deposition/etchback process and more particularly, relates to a method for preventing tungsten contact plug loss in a tungsten CVD deposition/etchback process after a backside pressure fault occurrence in a chemical vapor deposition chamber by heat treating the wafer at a temperature of at least 600° C. prior to the tungsten CVD deposition process.

BACKGROUND OF THE INVENTION

In the fabrication of semiconductor devices, metal contacts and vias are frequently formed in contact holes and via openings on silicon wafers that have been pre-processed with insulating layers on top. Devices are then fabricated by connecting the components with metal contacts and vias to form the integrated circuit. In particular, aluminum, aluminum alloys, tungsten and tungsten alloys are frequently used for depositing into contact holes and via openings on silicon substrates. The deposition process can be carried out either in a physical vapor deposition chamber or in a chemical vapor deposition chamber.

As the dimensions of semiconductor devices continuously to shrink in the miniaturization of modern semiconductor devices to the sub-half-micron range, via openings and contact holes must also shrink. Consequently, the openings and holes to be filled have larger aspect ratios, i.e., the ratios between the depth of the opening or hole and the diameter.

Difficulties have been encountered in depositing conductive metals into via openings and contact holes that have high aspect ratios by the conventional sputtering process. As the openings or holes become smaller and deeper, the bottom and sides of an opening or hole receive fewer deposited metal particles than the top surface of the device. The end result of such a phenomenon, sometimes called a shadowing effect, is that metal layers formed by the particles hang over the opening forming an overhang. The overhang closes before the opening is completely filled as the deposition process progresses and thus creating a void in the opening or hole.

One technique used to remedy the shadowing effect of the sputtering process is to use a tungsten chemical vapor deposition (W CVD) technique for filling openings and holes that have large aspect ratios. The W CVD process solves the difficult problems in metalization to ensure enough metal continuity in contact windows and vias. The step coverage of deep openings or holes by the W CVD particles is greatly improved over that possible by any other deposition techniques. In a W CVD process conducted on a silicon substrate for filling a contact hole, the basic chemistry is represented by:

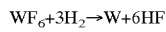

$$WF_6 + 3H_2 \rightarrow W + 6HF \quad \text{(Equation A)}$$

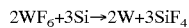

$$2WF_6 + 3Si \rightarrow 2W + 3SiF_4 \quad \text{(Equation B)}$$

There may also be reactions between $WF_6$ and $SiH_4$ and furthermore, $WF_6$ may be reduced by Al and Ti through different chemical processes.

During a W CVD deposition process, a wafer is usually held on a vacuum chuck that is heated to a temperature between about 400° C. and about 500° C. A shower head is positioned opposite to the wafer where $WF_6$, $H_2$ or $SiH_4$ gases are injected. Normally, a two-or three-step process is involved where $SiH_4$ is first introduced without any flow of $WF_6$ to initiate a deposition of a very thin seed layer of amorphous silicon as a prenucleation layer. The prenucleation process is then followed by a $SiH_4+WF_6$ silane reduction nucleation process for depositing a thin W nucleation layer, and then the faster-rate $H_2+WF_6$ hydrogen reduction process for bulk W deposition. During the nucleation stage, less than 100 nm of tungsten is deposited, while the bulk of the tungsten deposition is by the hydrogen reduction process. The multi-stage deposition process is designed such that during the initial nucleation stage, the silicon from the source/drain area is not consumed in the reaction since $WF_6$ would react readily with Si. When $WF_6$ reacts with Si from the source/drain region, a defect known as junction leakage may occur. The introduction of $SiH_4$ first into the reaction avoids the consumption of Si from the substrate. The initial introduction of $SiH_4$ into the reaction without $WF_6$ for the deposition of the prenucleation layer of Si is known as a silane soak step.

In the W CVD process, a W CVD is frequently blanket-deposited onto a wafer surface and into the contact holes after a metal nucleation layer is first deposited on the entire wafer. The W deposited on the insulating layer, i.e., a $SiO_2$ layer, is then etched off in an etchback process by a process of reactive ion etching. After the etchback process, only the thicker W in the contact holes are left. Since the process relies on the removal of all W CVD except in the contact holes, the uniformity of the W deposition and the RIE etchback process is critical for the successful formation of W contact plugs. When the process is not accurately controlled, such as with the pre-deposition of a nucleation layer of Ti/TiN, the W contact plugs may be substantially recessed after the etchback process and thus results in poor step coverage on the device.

In the deposition of contact plugs by the W CVD process, another process difficulty has been observed which is caused by the very nature of the excellent coverage capability of tungsten particles. In a CVD chamber where a wafer is held on a vacuum chuck, on the bottom side of the wafer and specifically around the edges of the wafer, tungsten particles may also deposit which causes a problem known as the backside pressure fault or BSPF. When a backside pressure fault occurs, the servo pressure (which indicates the chamber pressure) exceeds a maximum allowable value such that the deposition process must be stopped. When the backside pressure fault problem is corrected and the deposition process restarted in the process chamber, it has been noticed that the W contact plugs formed on the wafer surface, particularly around an edge portion of the wafer, are frequently defective and are lost after a W etchback process. The BSPF problem is believed to have been caused by the formation of uneven layers of $WSi_x$ from the prenucleation layer of Si, particularly at around the edges of the wafer due to a warped wafer or poorly positioned wafer on the vacuum chuck. It is believed that, when non-uniform $WSi_x$ layers are formed in the contact hole prior to the filling of the hole with bulk W, a dry etchant such as $SF_3$ etches the $WSi_x$ film at a much faster rate than the W layer (on top of the device) during an etchback process. This results in a complete loss of the W contact plug that was formed in the contact hole. A typical defect of a lost W contact plug is shown in FIG. 1 which was taken after an etchback process has been performed. In order to eliminate the backside pressure fault problem observed in a W CVD process, the formation of uneven $WSi_x$ films and the subsequent etching of the films by a dry etchant must be avoided.

It is therefore an object of the present invention to provide a method for forming a tungsten contact plug in a tungsten CVD process without the drawbacks or shortcomings of the conventional tungsten deposition methods.

It is another object of the present invention to provide a method for forming a tungsten contact plug in a W CVD process without the plug loss defect after a backside pressure fault has occurred in the process chamber.

It is a further object of the present invention to provide a method for forming a tungsten contact plug in a W CVD process without the plug loss defect by incorporating a heat treating step on the substrate prior to the deposition of tungsten for filling the contact hole.

It is another further object of the present invention to provide a method for forming a tungsten contact plug in a W CVD process without the plug loss defect by heat treating the substrate at a temperature of at least 600° C. for at least 10 seconds prior to the tungsten deposition process for filling the contact hole.

It is still another object of the present invention to provide a method for forming a tungsten contact plug in a W CVD process without the plug loss defect by heat treating the substrate at a temperature of at least 600° C. and by avoiding the formation of W $Si_x$ films in the contact hole.

It is still another further object of the present invention to provide a method for forming a tungsten contact plug in a W CVD process without the plug loss defect by first depositing a silicon prenucleation layer in the contact hole and then heat treating the substrate at a temperature of at least 600° C. such that substantially no $WSi_x$ is formed in the contact hole.

It is yet another further object of the present invention to provide a method for forming a tungsten contact plug in a W CVD process without the plug loss defect by first depositing a glue layer of Ti/TiN, and then depositing a silicon prenucleation layer in the contact hole prior to a heat treating process of the substrate at a temperature of at least 600° C. for at least 10 seconds such that substantially no $WSi_x$ film is formed in the contact hole.

SUMMARY OF THE INVENTION

In accordance with the present invention, a method for forming a tungsten contact plug in a W CVD process without the plug loss defect after a backside pressure fault occurrence in the deposition chamber is provided.

In the preferred embodiment, a method for forming a W contact plug in a W CVD process without the plug loss defect after a backside pressure fault occurrence in the process chamber can be carried out by the operating steps of first providing a pre-processed semi-conducting substrate, depositing an insulating layer on top of the substrate, forming at least one contact hole in the insulating layer, depositing a Si prenucleation layer in the at least one contact hole, heat treating the substrate at a temperature of at least 600° C. for making the Si prenucleation layer in the contact hole more uniform, and depositing W by a CVD process filling the at least one contact hole.

The method for forming a W plug in a W CVD process without plug loss problem may further include the step of depositing a Si prenucleation layer of less than 500 Å thick in the contact hole. The method may further include the step of observing a backside pressure fault in the CVD chamber and stopping the deposition process. The method may further include the step of depositing an insulating layer of oxide by a PETEOS method. The method may further include the step of heat treating a substrate for a time period sufficient to improve the uniformity of the silicon prenucleation layer in the contact hole. The method may further include the step of heat treating the substrate for a time period of between about 10 seconds and about 60 seconds. The method may further include the step of heat treating the substrate for a time period of not less than 10 seconds.

The method for forming a W contact plug in a W CVD process without the plug loss defect may further include the step of a $SiH_4$ soak. The $SiH_4$ soak step may be carried out at a $SiH_4$ pressure of less than 20 Torr. The $SiH_4$ soak step forms an atomic layer of Si as a prenucleation layer for a subsequent W nucleation layer deposition. The step of forming a contact hole may further include patterning the insulating layer by a lithographic method and etching the contact hole. The Si prenucleation layer deposited may form a Si-rich W layer after a W nucleation process. The method may further include the step of depositing a glue layer in the at least one contact hole prior to the deposition step for the Si prenucleation layer. The method may further include the step of depositing a Ti/TiN layer in the at least one contact hole prior to the deposition step for the Si prenucleation layer. The Si prenucleation layer deposited in the at least one contact hole substantially does not form $WSi_x$.

In an alternate embodiment, a method for forming a W contact plug in a W CVD process without the plug loss defect after a backside pressure fault occurrence in the process chamber can be carried out by the operating steps of providing a pre-processed silicon substrate which has an insulating layer on top, forming at least one contact hole in the insulating layer, depositing a Si prenucleation layer in the at least one contact hole, heat treating the substrate at a temperature of at least 600° C. for a time period of at least 10 seconds such that substantially no $WSi_x$ is formed, and depositing a W layer filling the at least one contact hole.

The method for forming a W contact plug in a W CVD process without the plug loss defect may further include the step of depositing a glue layer in the at least one contact hole prior to the deposition of the Si prenucleation layer. The Si prenucleation layer deposited may have a thickness of not more than 500Å. The insulating layer on the substrate may be an oxide layer. The method may further include the step of heat treating the substrate for a time period of between about 10 seconds and about 60 seconds. The method may further include the step of depositing a Si prenucleation layer in a $SiH_4$ soak step. The Si prenucleation layer deposited forms a Si-rich W layer after a W nucleation layer deposition.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses a method for forming a tungsten contact plug in a W CVD process that is without the plug loss defect after a backside pressure fault occurrence has been observed in a CVD process chamber. The process incorporates an additional step of heat treating by a rapid thermal process wherein the substrate is heated to a temperature of at least 600° C. for a time period of at least 10 seconds. It is preferred that the substrate be heat treated for a time period of between about 10 seconds and about 60 seconds. Prior to the heat treatment step, the contact holes are first coated with a Si prenucleation layer in a silane soak step. It is believed that the present invention novel method of heat treating the substrate makes the Si prenucleation layer more uniform such that substantially no $WSi_x$ film is formed after a nucleation layer of tungsten is subsequently deposited on top of the Si prenucleation layer. After the heat treatment process, a hydrogen reduction process for depositing bulk tungsten by a CVD technique is used to completely fill the contact hole and to form the contact plug. The contact plug formed by the present invention method does not have a plug loss defect after a tungsten etchback process is conducted on the substrate.

Figures 2, 3:
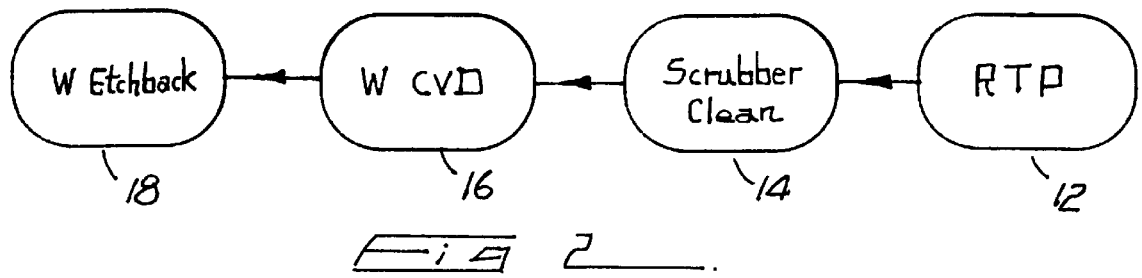
FIG. 2 is a process flow chart for the present invention novel method for forming tungsten contact plugs without the plug loss defect.
FIG. 3 is a chart illustrating test data for samples with and without the present invention heat treatment step.

The present invention novel method may be described by the process flow chart 10 shown in FIG. 2. In the next step 12 of the present invention novel method, a rapid thermal process (RTP) is used to heat treat the silicon substrate. In the rapid thermal process, the silicon substrate is heated to a temperature of at least 600° C., and preferably a temperature of at least 690° C. The time required for the heat treatment is not less than 10 seconds, and preferably between about 10 seconds and about 60 seconds. The heat treatment process conducted by the RTP method makes the silicon prenucleation layer deposited previously in a silane soak step more uniform such that substantially no $W Si_x$ film is formed after a subsequent W nucleation layer is deposited.

In the next step 14 of the process, the silicon substrate is scrubber cleaned to eliminate any contaminating particles which may have been left on the substrate surface during the heat treating step. In the next step 16 of the process, a tungsten CVD process is conducted to fill the contact holes and to form the contact plugs followed by a tungsten etch back process 26 for removing the excess tungsten layer on top of the substrate. During the silane soak process, a silane gas of $SiH_4$ is flown into the process chamber to a pressure of about 30 Torr such that an atomic layer, or a prenucleation layer of Si may be formed as a seed layer for the subsequent tungsten nucleation layer deposition. The present invention novel method prevents substantially the formation of any tungsten silicide, or $WSi_x$ films in the contact hole such that $WSi_x$ is not etched at a much faster rate by the dry etchant in the subsequent W etchback process resulting in the loss of the plug.

The desirable results achieved by the present invention novel method of heat treating a silicon substrate prior to the tungsten CVD process is shown in FIG. 3. Ten different samples are presented in FIG. 3 wherein sample 1 did not exhibit the backside pressure fault problem however, the process was arbitrarily stopped after the "check BSPF" step. While a vacuum break has occurred in the process chamber, the substrate is not annealed and not scrubbed resulting in no tungsten plug loss. In samples 2, 3 and 4, the backside pressure fault defect occurred in the process chamber and the silicon substrates were not subsequently annealed. It is seen that tungsten plug loss defect has occurred in all three samples. The samples processed by the present invention novel method are shown as samples 5, 6, 7, 8, 9 and 10. In samples 5 and 6, the backside pressure fault problem has occurred in the process chamber, and the silicon substrate is annealed at 690° C. for 10 seconds with substantially no plug loss defect found. Samples 7–10 were similarly observed with a backside pressure fault defect, and annealed at 690° C. for a time period of 20 seconds, 30 seconds, 45 seconds and 60 seconds, respectively. The plug loss defect was not found after the tungsten plug etchback process in any of the four samples.

Figure 1:
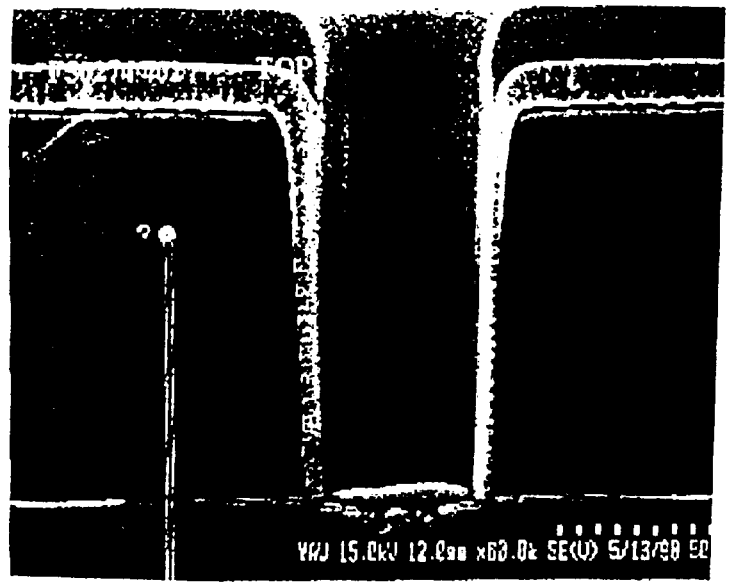
FIG. 1 is an en-larged, cross-sectional view of a contact hole for a tungsten contact plug that was formed by a conventional method and lost after an etchback process.
Figure 4:
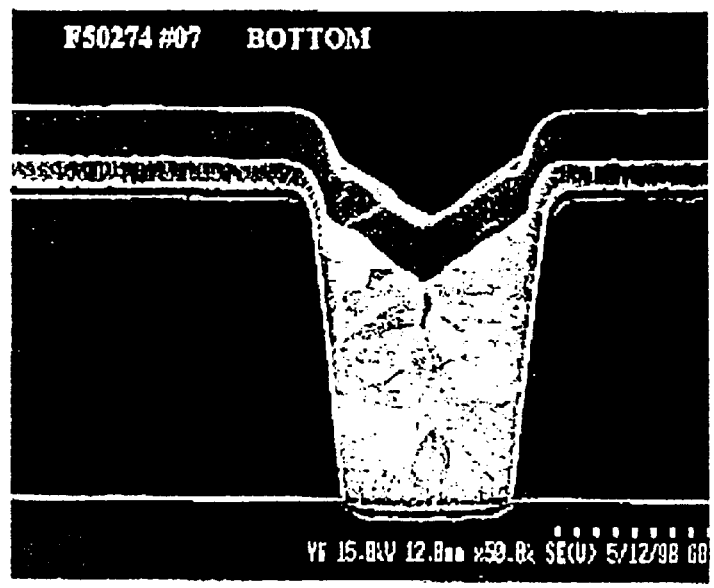
FIG. 4 is an enlarged, cross-sectional view of a tungsten contact plug formed by the present invention novel method after a tungsten etchback step.

An enlarged, cross-sectional view of a tungsten plug formed by the present invention novel method incorporating the RTP heat treatment step is shown in FIG. 4. After the tungsten etchback step, the plug formed in the contact hole is not affected at all even though a backside pressure fault was previously observed in the process chamber. The effectiveness of the present invention novel method which utilizes a RTP thermal treatment step has therefore been clearly demonstrated in the appended drawings of FIGS. 2–4.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

1. A method for forming a tungsten contact plug in a W CVD process without plug loss problem after a backside pressure fault occurrence comprising the steps of:

depositing a Si prenucleation layer in at least one contact hole in a substrate, heat treating said substrate at a temperature of at least 600° C. for improving the uniformity of said Si prenucleation layer in said at least one contact hole in the substrate, and depositing tungsten by a CVD process filling said at least one contact hole in the substrate.

2. A method for forming a tungsten plug in a W CVD process without plug loss problem after a backside pressure fault occurrence according to claim 1 further comprising the step of depositing a Si prenucleation layer of less than 500Å thick in said at least one contact hole in the substrate.

3. A method for forming a tungsten plug in a W CVD process without plug loss problem after a backside pressure fault occurrence according to claim 2 further comprising the step of observing a backside pressure fault in said CVD chamber and stopping said Si prenucleation layer deposition process.

4. A method for forming a tungsten plug in a W CVD process without plug loss problem after a backside pressure fault occurrence according to claim 1 further comprising the step of depositing said insulating layer of oxide by a PETEOS method.

5. A method for forming a tungsten plug in a W CVD process without plug loss problem after a backside pressure fault occurrence according to claim 1 further comprising the step of heat treating said substrate for a time period sufficient to make said Si prenucleation layer more uniform in said at least one contact hole in the substrate.

6. A method for forming a tungsten plug in a W CVD process without plug loss problem after a backside pressure fault occurrence according to claim 1 further comprising the step of heat treating said substrate for a time period of not less than 10 seconds.

7. A method for forming a tungsten plug in a W CVD process without plug loss problem after a backside pressure fault occurrence according to claim 1 further comprising the step of heat treating said substrate for a time period between about 10 seconds and about 60 seconds.

8. A method for forming a tungsten plug in a W CVD process without plug loss problem after a backside pressure fault occurrence according to claim 1, wherein said step of foming a prenucleation layer comprises a $SiH_4$ soak step.

9. A method for forming a tungsten plug in a W CVD process without plug loss problem after a backside pressure fault occurrence according to claim 8, wherein said $SiH_4$ soak step is carried out at a $SiH_4$ pressure of less than 20 Torr.

10. A method for forming a tungsten plug in a W CVD process without plug loss problem after a backside pressure fault occurrence according to claim 8, wherein said $SiH_4$ soak step forms an atomic layer of Si as a prenucleation layer for subsequent W nucleation layer deposition.

11. A method for forming a tungsten plug in a W CVD process without plug loss problem after a backside pressure fault occurrence according to claim 1, wherein said Si prenucleation layer deposited forms a Si-rich W layer after a W nucleation process.

12. A method for forming a tungsten plug in a W CVD process without plug loss problem after a backside pressure fault occurrence according to claim 1, wherein said Si prenucleation layer deposited in said at least one contact hole in the substrate substantially does not form tungsten silicide.

13. A method for forming a tungsten contact plug in a W CVD process without plug loss problem after a backside pressure fault occurrence comprising the steps of:
   depositing a Si prenucleation layer in at least one contact hole in a substrate,
   heat treating said substrate at a temperature of at least 600° C. for a time period of at least 10 seconds such that substantially no tungsten silicide is formed, and
   depositing a W layer filing said at least one contact hole in the substrate.

14. A method for forming a tungsten contact plug in a W CVD process without plug loss problem according to claim 13, wherein said Si prenucleation layer deposited has a thickness of not more than 500 Å.

15. A method for forming a tungsten contact plug in a W CVD process without plug loss problem according to claim 13, wherein said insulating layer is an oxide layer.

16. A method for forming a tungsten contact plug in a W CVD process without plug loss problem according to claim 13 further comprising the step of heat treating said substrate for a time period between about 10 seconds and about 60 seconds.

17. A method for forming a tungsten contact plug in a W CVD process without plug loss problem according to claim 13 further comprising the step of depositing a Si prenucleation layer in a $SiH_4$ soak process.

* * * * *